(12) United States Patent
Amiya et al.

(10) Patent No.: US 11,757,070 B2
(45) Date of Patent: *Sep. 12, 2023

(54) LIGHT EMITTING DEVICE WITH CE-ACTIVATED ALUMINATE FLUORESCENT MATERIAL

(71) Applicant: NICHIA CORPORATION, Anan (JP)

(72) Inventors: Mika Amiya, Naruto (JP); Shoji Hosokawa, Tokushima (JP)

(73) Assignee: NICHIA CORPORATION, Anan (JP)

(*) Notice: Subject to any disclaimer, the term of this patent is extended or adjusted under 35 U.S.C. 154(b) by 264 days.

This patent is subject to a terminal disclaimer.

(21) Appl. No.: 17/139,655

(22) Filed: Dec. 31, 2020

(65) Prior Publication Data
US 2021/0126169 A1  Apr. 29, 2021

Related U.S. Application Data

(63) Continuation of application No. 16/227,791, filed on Dec. 20, 2018, now Pat. No. 10,910,526.

(30) Foreign Application Priority Data

Dec. 26, 2017  (JP) .................. 2017-250037

(51) Int. Cl.
*H01L 33/50* (2010.01)
*H01L 33/32* (2010.01)
*H01L 25/075* (2006.01)

(52) U.S. Cl.
CPC ........ *H01L 33/504* (2013.01); *H01L 25/0753* (2013.01); *H01L 33/32* (2013.01)

(58) Field of Classification Search
CPC .... H01L 33/504; H01L 33/32; H01L 25/0753
See application file for complete search history.

(56) References Cited

U.S. PATENT DOCUMENTS

| | | | |
|---|---|---|---|
| 2003/0132701 A1 | 7/2003 | Sato et al. | |
| 2012/0146079 A1 | 6/2012 | Baumann et al. | |
| 2014/0307417 A1* | 10/2014 | Yamakawa | ............. F21K 9/232 362/84 |

(Continued)

FOREIGN PATENT DOCUMENTS

| CN | 106601892 A | 4/2017 |
|---|---|---|
| JP | 2008034188 A | 2/2008 |

(Continued)

*Primary Examiner* — Lex H Malsawma
(74) *Attorney, Agent, or Firm* — Hunton Andrews Kurth LLP

(57) ABSTRACT

Provided is a light emitting device, including a first light emitting element having a light emission peak wavelength within a range of 400 nm or more and 490 nm or less, a second light emitting element having a different light emission peak wavelength from the first light emitting element within a range of 400 nm or more and 490 nm or less, a first fluorescent material that is excited by at least one of the first light emitting element and the second light emitting element and emits light having a light emission peak wavelength within a range of 500 nm or more and 540 nm or less, and a second fluorescent material, wherein the first fluorescent material is a Ce-activated aluminate fluorescent material containing Lu, Al, and Ga, and optionally at least one element selected from rare earth elements other than Lu.

17 Claims, 8 Drawing Sheets

(56) References Cited

U.S. PATENT DOCUMENTS

| | | | |
|---|---|---|---|
| 2015/0221835 A1* | 8/2015 | Tischler | H01L 25/165 438/27 |
| 2016/0111609 A1 | 4/2016 | Baumann et al. | |
| 2016/0284959 A1* | 9/2016 | Ishikawa | H01L 25/0753 |
| 2017/0005239 A1 | 1/2017 | Asai et al. | |
| 2017/0058197 A1* | 3/2017 | Nishimata | H01L 33/32 |
| 2017/0309795 A1 | 10/2017 | Kim et al. | |
| 2019/0198724 A1 | 6/2019 | Amiya et al. | |

FOREIGN PATENT DOCUMENTS

| | | |
|---|---|---|
| JP | 20130502711 A | 1/2013 |
| JP | 2014095029 A | 5/2014 |
| JP | 2015126160 A | 7/2015 |
| JP | 2016004981 A | 1/2016 |
| JP | 2016219519 A | 12/2016 |
| JP | 2017531324 A | 10/2017 |

* cited by examiner

LIGHT EMITTING DEVICE WITH CE-ACTIVATED ALUMINATE FLUORESCENT MATERIAL

CROSS-REFERENCE TO RELATED PATENT APPLICATION

This is a continuation application of U.S. patent application Ser. No. 16/227,791, filed Dec. 20, 2018, which claims priority under 35 U. S. C. § 119 to Japanese Patent Application No. 2017-250037, filed Dec. 26, 2017, the disclosure of which is hereby incorporated by reference in its entirety.

BACKGROUND

Technical Field

The present disclosure relates to a light emitting device.

Description of Related Art

As a light emitting device emitting a white light using a light emitting diode (hereinafter also referred to as "LED"), for example, a light emitting device capable of emitting a whitish mixed light has been developed, in which an LED emitting a blue light is combined with a fluorescent material emitting a yellowish green to green light and a fluorescent material emitting a red light, which are excited by the blue light. Such a light emitting device using an LED is spread in a broad field including general lightings, in-car lightings, displays, backlights for liquid crystal, and so on.

In particular, a light emitting device using an LED to be used in the lighting field is required to be more improved regarding a visibility of an object on using it as a light source. That is, the light emitted by the aforementioned light emitting device using an LED and sunlight are different from each other in terms of a light emission spectrum, and therefore, in the case of lighting an object with each light as a light source, a phenomenon in which a color shade of the lighted object looks different is generated. A nature as the light source, which brings about such a difference in visibility of the object, is called "color rendering property". In general, a light source capable of expressing the visibility more resembling the object on irradiation with sunlight is evaluated to be good in color rendering property. For that reason, the aforementioned light emitting device using an LED is required to be improved in the color rendering property as the light source.

An evaluation procedure of color rendering property as a light source is prescribed in JIS Z8726. Specifically, it is determined through calculation of color rendering indexes in such a manner that in the case where 15 kinds of test colors (Nos. 1 to 15) having predetermined reflectance characteristics are measured for colors with a test light source and a reference light source, respectively, color differences $\Delta Ei$ (wherein i represents an integer of 1 to 15) are numerically calculated therefrom. As for each of values of special color rendering indexes Ri (wherein i represents an integer of 1 to 15) to be calculated herein, an upper limit thereof is 100, and as a color difference between the test light source and the reference light source with a color temperature corresponding thereto is smaller, the color rendering index is increased and is close to 100. In addition, among the special color rendering indexes Ri, R1 to R8 are evaluated as a general color rendering index (hereinafter referred to simply as "Ra") that is an average value of these values, and R9 to R15 are evaluated as an individual value as a special color rendering index. With respect to the special color rendering indexes R9 to R15, it is designated that R9 is for red, R10 is for yellow, R11 is for green, R12 is for blue, R13 is for the Caucasian skin color, R14 is for the color of leaves, and R15 is for the Japanese skin color.

PTL 1 (JP 2008-034188 A) proposes, as a light emitting device with an improved color rendering property, a light emitting device using two kinds of blue LEDs having a different wavelength from each other, in addition to a fluorescent material emitting a green to yellow light and a fluorescent material emitting a red light. In this light emitting device, by using the two kinds of blue LEDs having a different wavelength from each other, the color rendering property such that the general color rendering index Ra is about 85 to 95 is realized. However, even such a light emitting device has not thoroughly enhanced yet all of the individual values of the special color rendering indexes R9 to R15.

SUMMARY

According to an aspect of the present disclosure, a light emitting device including a first light emitting element having a light emission peak wavelength within a range of 400 nm or more and 490 nm or less, a second light emitting element having a different light emission peak wavelength from the first light emitting element within a range of 400 nm or more and 490 nm or less, a first fluorescent material that is excited by at least one of the first light emitting element and the second light emitting element and emits light having a light emission peak wavelength within a range of 500 nm or more and 540 nm or less, and a second fluorescent material that is excited by at least one of the first light emitting element and the second light emitting element and emits light having a light emission peak wavelength within a range of 600 nm or more and 680 nm or less, wherein the first fluorescent material is a Ce-activated aluminate fluorescent material containing Lu, Al, and Ga, and optionally at least one element selected from rare earth elements other than Lu.

In accordance with an aspect of the present disclosure, it is possible to provide a light emitting device having an excellent color rendering property in a wide range of correlated color temperature.

BRIEF DESCRIPTION OF DRAWINGS

The disclosure will become more fully understood from the following detailed description, taken in conjunction with the accompanying figures.

DETAILED DESCRIPTION

Figure 1A:
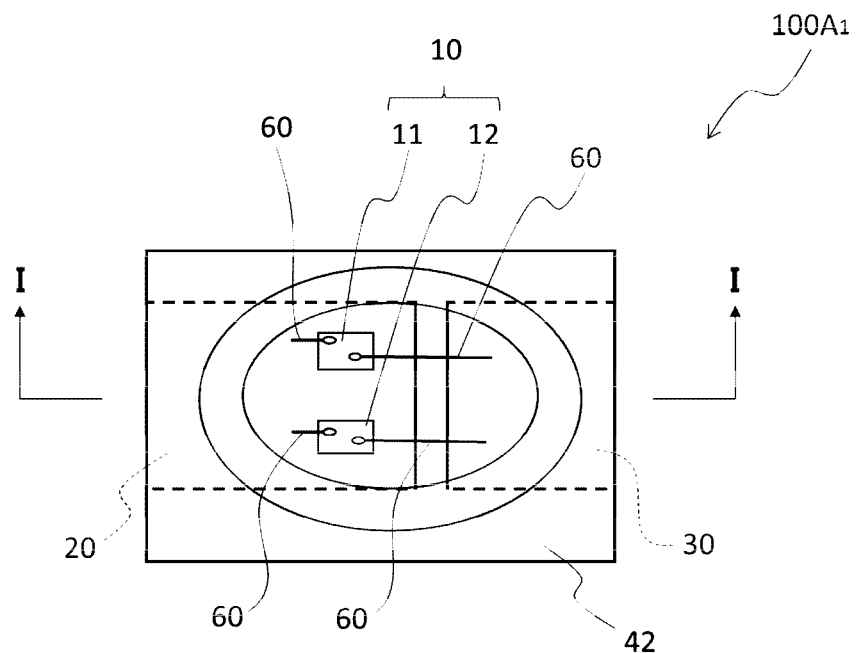
FIG. 1A is a schematic plan view showing a light emitting device according to an embodiment of the present disclosure.

A more complete appreciation of the invention and many of the attendant advantages thereof will be readily obtained as the same becomes better understood by reference to the following detailed description when considered in connection with the accompanying drawings.

Embodiments for carrying out the present disclosure are hereunder described. However, the embodiments described below only exemplify light emitting devices for practicing the technical concept of the present invention, and the present invention is not limited to the following light emitting devices.

A relationship between a color name and a chromaticity coordinate, a relationship between a wavelength range of a light and a color name of a monochromic light, and the like are in accordance with JIS Z8110. In addition, in the case where a composition contains plural substances corresponding to respective components, the content of each component in the composition means a total amount of the plural substances contained in the composition, unless otherwise indicated.

A half width of the fluorescent material means a wavelength width of the light emission spectrum showing the light emission intensity of 50% of a maximum light emission intensity in a light emission spectrum of the fluorescent material.

Light Emitting Device

An embodiment of the present disclosure is concerned with a light emitting device including a first light emitting element having a light emission peak wavelength within a range of 400 nm or more and 490 nm or less, a second light emitting element having a different light emission peak wavelength from the first light emitting element within a range of 400 nm or more and 490 nm or less, a first fluorescent material that is excited by at least one of the first light emitting element and the second light emitting element and emits light having a light emission peak wavelength within a range of 500 nm or more and 540 nm or less, and a second fluorescent material that is excited by at least one of the first light emitting element and the second light emitting element and emits light having a light emission peak wavelength within a range of 600 nm or more and 680 nm or less, the first fluorescent material that is a Ce-activated aluminate fluorescent material containing Lu, Al, Ga, and optionally at least one element selected from rare earth elements other than Lu.

The light emitting device according to an embodiment of the present disclosure emits a mixed light of a bluish purple to blue light emitted from the two kinds of light emitting elements and green and red fluorescence emitted from the two kinds of fluorescent materials and has an excellent color rendering property. In particular, when the two kinds of light emitting elements having a different light emission peak wavelength from each other within a range of 400 nm or more and 490 nm or less are used in combination as the light emitting element emitting a bluish purple to blue light, the light emission intensity can be maintained high in a wider wavelength region, and the color rendering property can be efficiently improved, as compared with the case of using one kind of light emitting device. In addition, when the first fluorescent material which is excited by at least one of the aforementioned two kinds of light emitting elements and emits light having a light emission peak wavelength within a range of 500 nm or more and 540 nm or less, the first fluorescent material that is a Ce-activated aluminate fluorescent material containing Lu, Al, Ga, and optionally at least one element selected from rare earth elements other than Lu, is used as the fluorescent material emitting a green light, the color rendering property can be improved. Such a light emitting device is able to make a light emitting spectrum of the light emitting device close to a light emitting spectrum of a reference light source in a wide wavelength region of from the short wave side to the long wave side and to exhibit an excellent color rendering property in a wide range of correlated color temperature.

Light Emission Characteristics

CIE (International Commission on Illumination) has announced the guideline for color rendering property that fluorescent lamps should have, in 1986, and according to the guideline, a favorable general color rendering index (an average value of special color rendering indexes R1 to R8; hereinafter referred to simply as "Ra") appropriate to the place of use is 60 or more and less than 80 for factories for general operations, 80 or more and less than 90 for residential houses, hotels, restaurants, shops, offices, schools, hospitals, factories for precise operations, and the like, and 90 or more for places for clinical laboratories requiring a high color rendering property, museums, and the like. However, a higher color rendering property than those described above tends to be required at present.

The light emitting device according to an embodiment of the present disclosure exhibits an especially excellent color rendering property. Specifically, Ra of the light emitting device is, for example, 80 or more, preferably 90 or more, and more preferably 95 or more. In addition, the special color rendering indexes R9, R10, R11, R12, R13, R14, and R15 of the light emitting device are each, for example, 80 or more, preferably 85 or more, and more preferably 88 or more, and furthermore, it is preferred that all of them are 88 or more.

The light emitted by the light emitting device according to an embodiment of the present disclosure is a mixed light of a light emitted by the two kinds of light emitting elements and fluorescence emitted by the first fluorescent material and the second fluorescent material, and for example, it can be a light included in a range of x=0.28 to 0.55 and y=0.29 to 0.44 in the chromaticity coordinate prescribed in CIE 1931, or can be a light included in a range of x=0.31 to 0.45 and y=0.32 to 0.43.

The correlated color temperature of the light emitted by the light emitting device according to an embodiment of the present disclosure can be set to, for example, 2,000 K or more, or can also be set to 3,000 K or more. In addition, the correlated color temperature may be set to 7,000 K or less, or may also be set to 6,500 K or less.

Components of Light Emitting Device

The light emitting device according to an embodiment of the present disclosure includes a first light emitting element, a second light emitting element, a first fluorescent material, and a second fluorescent material. The light emitting device according to an embodiment of the present disclosure may also include other members than those described above, as the need arises. Every constitutional member is hereunder described in detail.

Molded Article

The light emitting device according to an embodiment of the present disclosure may include at least one molded article, as the need arises. Here, the molded article plays a role to dispose a light emitting element and a fluorescent material and includes at least one light emitting element and at least one fluorescent material. Such a molded article forms a depression having a bottom surface and a side surface, and the light emitting element may be mounted on the bottom surface of the depression. Though a single molded article may be used alone, two or more molded articles may be used in combination.

In the case where the light emitting device according an embodiment of the present disclosure includes only one molded article, the foregoing one molded article disposes all of the first light emitting element, the second light emitting element, the first fluorescent material, and the second fluorescent material. In this case, the integrality as a light emitting device is good.

In the case where the light emitting device according an embodiment of the present disclosure includes two molded articles, the first light emitting element is mounted within one molded article, and the second light emitting element is mounted within the other molded article. In addition, the first fluorescent material and the second fluorescent material are disposed in at least one of the aforementioned two molded articles. In this case, an output light can be regulated for every molded article, and therefore, flexibility in designing the light emitting device is improved.

Light Emitting Element

The light emitting device according to an embodiment of the present disclosure includes a first light emitting element having a light emission peak wavelength within a range of 400 nm or more and 490 nm or less, a second light emitting element having a different light emission peak wavelength from the first light emitting element within a range of 400 nm or more and 490 nm or less. By using the two kinds of light emitting elements having a different light emission peak wavelength from each other, the light emission intensity can be maintained high in a wider wavelength region, and the color rendering property can be efficiently improved, as compared with the case of using one kind of light emitting device. By using such two kinds of light emitting elements as excitation light sources, a light emitting device with an excellent color rendering property, which emits a mixed light of a light emitted by the light emitting elements and fluorescence emitted by the fluorescent materials, can be constituted.

Each of the light emission peak wavelengths of the first light emitting device and the second light emitting device falls within a range of 400 nm or more and 490 nm or less, preferably within a range of 405 nm or more and 485 nm or less, more preferably within a range of 410 nm or more and 480 nm or less, and still more preferably within a range of 413 nm or more and 475 nm or less.

Individually, the light emission peak wavelength of the first emitting element is preferably within a range of 400 nm or more and less than 450 nm, more preferably within a range of 405 nm or more and 445 nm or less, still more preferably within a range of 410 nm or more and 440 nm or less, and yet still more preferably within a range of 413 nm or more and 438 nm or less.

The light emission peak wavelength of the second emitting element is preferably within a range of 450 nm or more and 490 nm, more preferably within a range of 452 nm or more and 485 nm or less, still more preferably within a range of 454 nm or more and 480 nm or less, and yet still more preferably within a range of 455 nm or more and 475 nm or less.

A difference in the light emission peak wavelength between the first light emitting element and the second light emitting element is preferably 5 nm or more, and more preferably 10 nm or more. In addition, the difference in the light emission peak wavelength between the first light emitting element and the second light emitting element may be, for example, 60 nm or less.

When the light emission peak wavelengths of the first light emitting element and the second light emitting element are in the aforementioned relation, the light emission intensity in a blue region can be suitably regulated, and the color rendering property can be efficiently improved.

A half width of each of the first light emitting element and the second light emitting element can be, for example, 30 nm or less.

For the aforementioned light emitting element, for example, it is preferred to use a semiconductor light emitting element, such as an LED. By using a semiconductor light emitting element as the light source, a light emitting device that has a high efficiency and a high linearity of the output with respect to the input and is stable with high resistance to mechanical impacts can be obtained.

As the semiconductor light emitting element, for example, a semiconductor light emitting element emitting a blue light or the like, which is composed of a nitride-based semiconductor ($In_XAl_YGa_{1-X-Y}N$, wherein X and Y satisfy $0 \leq X$, $0 \leq Y$, and $(X+Y) \leq 1$), can be used.

The light emitting device according to an embodiment of the present disclosure may further include at least one other light emitting element than the first light emitting element and the second light emitting element, as the need arises.

Fluorescent Material

The light emitting device according to an embodiment of the present disclosure includes a first fluorescent material which is excited by at least one of the first light emitting element and the second light emitting element and emits light having a light emission peak wavelength within a range of 500 nm or more and 540 nm or less and having a predetermined composition, and a second fluorescent material which is excited by at least one of the first light emitting element and the second light emitting element and emits light having a light emission peak wavelength within a range of 600 nm or more and 680 nm or less. Such first fluorescent material and second fluorescent material use the aforementioned light emitting elements as excitation light sources, absorb the lights emitted from the light emitting elements, and emit a green light and a red light, respectively. By using such two kinds of fluorescent materials, a light emitting device with an excellent color rendering property, which emits a mixed light of a light emitted by the light emitting elements and fluorescence emitted by the fluorescent materials, can be constituted.

Though the light emitting device according to an embodiment of the present disclosure includes the first fluorescent material and the second fluorescent material, each of the first fluorescent material and the second fluorescent material is not limited to a single kind of composition, a combination of plural kinds of fluorescent materials having a different composition from each other may also be used. In addition, other fluorescent material than the first fluorescent material and the second fluorescent material may be contained. Each of the fluorescent materials is hereunder described in detail.

First Fluorescent Material

The first fluorescent material is a fluorescent material which is excited by at least one of the first light emitting element and the second light emitting element and emits light having a light emission peak wavelength within a range of 500 nm or more and 540 nm or less, the first fluorescent material that is a Ce-activated aluminate fluorescent material containing Lu, Al, Ga, and optionally at least one element selected from rare earth elements other than Lu. Such a first fluorescent material absorbs a bluish purple to blue light from at least one of the first light emitting element and the second light emitting element and is excited by this to emit a green light. In addition, by including the first fluorescent material having such a predetermined composition, the color rendering property of the light emitting device can be improved. The first fluorescent material having this specified composition is hereinafter also referred to as "G-LAG" or "LuAGG".

The first fluorescent material is preferably a fluorescent material having a composition represented by the following formula (I).

$$(Lu_{1-x}Ln_x)_3(Al_{1-y}Ga_y)_5O_{12}:Ce \quad (I)$$

Here, in the formula (I), Ln is at least one rare earth element selected from the group consisting of Y, Gd, and Tb; and x and y are numbers respectively satisfying $0 \leq x \leq 0.7$ and $0 < y \leq 0.5$, and preferably numbers satisfying $0.001 \leq x \leq 0.3$ and $0.01 \leq y \leq 0.40$.

The light emission peak wavelength of the first fluorescent material is 500 nm or more and 540 nm or less, preferably 500 nm or more and 535 nm or less, and more preferably 500 nm or more and 530 nm or less. By allowing it to fall within the aforementioned range, the light emission intensity of the light emission spectrum in a blue to green region over from the light emission peak of the light emitting element to the light emission peak of the first fluorescent material can be thoroughly maintained, and the light emission spectrum of the light emitted from the light emitting device can be made close to the light emission spectrum of the reference light source.

A half width of the light emission spectrum of the first fluorescent material is preferably 90 nm or more and 120 nm or less, more preferably 92 nm or more and 118 nm or less, and still more preferably 95 nm or more and 115 nm or less. By allowing it to fall within the aforementioned range, the light emission spectrum in a green to yellow region of the light emitted from the light emitting device can be made close to the light emission spectrum of the reference light source.

As for the first fluorescent material, a single kind of fluorescent material may be used alone, or two or more kinds of fluorescent materials that are different in at least one of the constitutional elements and a content thereof may also be used in combination.

A content ratio of the first fluorescent material relative to the total fluorescent material amount is preferably 70% by mass or more, more preferably 75% by mass or more, still more preferably 80% by mass or more, and yet still more preferably 90% by mass or more. In addition, the content ratio of the first fluorescent material relative to the total fluorescent material amount is preferably 99% by mass or less, more preferably 98% by mass or less, and still more preferably 97% by mass or less. When the content ratio falls within the aforementioned range, the light emission spectrum of the light emitting device emitting a light having a correlated color temperature of 2,000 K or higher and 7,000 K or lower can be made closer to the reference light source, and therefore, the color rendering property can be more enhanced. In this specification, the total fluorescent material amount means a total amount (mass) of all of the fluorescent materials which the light emitting device includes (hereinafter the same).

Second Fluorescent Material

The second fluorescent material is a fluorescent material which is excited by at least one of the first light emitting element and the second light emitting element and emits light having a light emission peak wavelength within a range of 600 nm or more and 680 nm or less. Such a second fluorescent material absorbs a bluish purple to blue light from at least one of the first light emitting element and the second light emitting element and is excited by this to emit a red light.

Examples of such a second fluorescent material include a nitride fluorescent material that is activated by at least one element selected from the group consisting of Eu, Ce, and Mn, a Eu-activated alkaline earth sulfide fluorescent material, a Mn-activated fluorogermanate fluorescent material, and a Mn-activated halide fluorescent material. Above all, a Eu-activated nitride fluorescent material and a Mn-activated halide fluorescent material are preferred. In addition, as for the second fluorescent material, a single kind of fluorescent material may be used alone, or two or more kinds of fluorescent materials having a different composition from each other may also be used in combination.

As the Eu-activated nitride fluorescent material, at least one of a Eu-activated nitride fluorescent material containing Al, Si and at least one element selected from Sr and Ca; and a Eu-activated nitride fluorescent material containing Al, at least one element selected from the group consisting of alkaline earth metal elements, and at least one element selected from the group consisting of alkali metal elements is preferred.

As the Mn-activated halide fluorescent material, a Mn-activated fluoride fluorescent material containing fluorine, at least one element or ion selected from the group consisting of an alkali metal element and an ammonium ion ($NH_4^+$), at least one element selected from the group consisting of an element belonging to the Group 4 and an element belonging to the Group 14 is preferred.

It is preferred that the second fluorescent material contains a Eu-activated nitride fluorescent material. In particular, the second fluorescent material is preferably a Eu-activated nitride fluorescent material containing Al, Si, and at least one element selected from Sr and Ca.

Such a second fluorescent material is preferably a fluorescent material having a composition represented by the following formula (II).

$$Sr_sCa_tAl_uSi_vN_w:Eu \quad (II)$$

Here, in the formula (II), s, t, u, v, and w are numbers respectively satisfying $0 \leq s \leq 1$, $0 \leq t \leq 1$, $0.8 \leq (s+t) \leq 1$, $0.9 \leq u \leq 1.1$, $0.9 \leq v \leq 1.1$, and $2.5 \leq w \leq 3.5$, and preferably numbers satisfying $0 \leq s \leq 0.95$, $0.05 \leq t \leq 1$, $0.85 \leq (s+t) \leq 1.0$, $0.90 \leq u \leq 1.05$, $0.95 \leq v \leq 1.1$, and $2.7 \leq w \leq 3.3$.

The send fluorescent material preferably contains at least one of a fluorescent material having a composition represented by the following formula (II-1) and a fluorescent material having a composition represented by the following formula (II-2), more preferably contains a fluorescent material having a composition represented by the following formula (II-1), and still more preferably contains both a fluorescent material having a composition represented by the following formula (II-1) and a fluorescent material having a composition represented by the following formula (II-2).

$$Ca_tAl_uSi_vN_w:Eu \quad (II\text{-}1)$$

$$Sr_sCa_tAl_uSi_vN_w:Eu \quad (II\text{-}2)$$

In the formula (II-1), t is $0<t\leq1$, and u, v, and w are the same ranges as in the formula (II), respectively; and preferably, $0.85\leq t\leq 1.0$, $0.90\leq u\leq 1.05$, $0.95\leq v\leq 1.1$, and $2.7\leq w\leq 3.3$. By containing such a fluorescent material, the color rendering property of the light emitting device can be improved. The second fluorescent material of this specified composition is hereinafter also referred to as "CASN".

In the formula (II-2), s and t are each $0<s\leq 1$ and $0<t\leq 1$, and u, v, and w are the same ranges as in the formula (II), respectively; and preferably, $0.05\leq s\leq 0.95$, $0.05\leq t\leq 0.95$, $0.85\leq(s+t)\leq 1.0$, $0.90\leq u\leq 1.05$, $0.95\leq v\leq 1.1$, and $2.7\leq w\leq 3.3$. By containing such a fluorescent material, the color rendering property of the light emitting device can be improved. The second fluorescent material of this specified composition is hereinafter also referred to as "SCASN".

The second fluorescent material may contain a fluorescent material having any one of compositions represented by the following formulae (III) to (VII) in addition to, or in place of, the fluorescent material having the composition of the formula (II).

$$M^a_vM^b_wM^c_xAl_{3-y}Si_yN_z \quad (III)$$

In the formula (III), $M^a$ is at least one element selected from the group consisting of Ca, Sr, Ba, and Mg; $M^b$ is at least one element selected from the group consisting of Li, Na, and K; $M^c$ is at least one element selected from the group consisting of Eu, Ce, and Mn; and v, w, x, y, and z are numbers respectively satisfying $0.80\leq v\leq 1.05$, $0.80\leq w\leq 1.05$, $0.001<x\leq 0.1$, $0\leq y\leq 0.5$, and $3.0\leq z\leq 5.0$.

$$(Ca_{1-r-s-t}Sr_rBa_sEu_t)_2Si_5N_8 \quad (IV)$$

In the formula (IV), r, s, and t are numbers respectively satisfying $0\leq r\leq 1.0$, $0\leq s\leq 1.0$, $0<t<1.0$, and $(r+s+t)\leq 1.0$.

$$(Ca,Sr)S:Eu \quad (V)$$

$$(i\text{-}j)MgO\cdot(j/2)Sc_2O_3\cdot kMgF_2\cdot mCaF_2\cdot(1-n)GeO_2\cdot(n/2)M^r_2O_3{:}zMn \quad (VI)$$

In the formula (VI), $M^r$ is at least one selected from the group consisting of Al, Ga, and In; and i, j, k, m, n, and z are numbers respectively satisfying $2\leq i\leq 4$, $0<k<1.5$, $0<z<0.05$, $0\leq j<0.5$, $0<n<0.5$, and $0\leq m<1.5$.

$$A_2[M^1_{1-u}Mn_uF_6] \quad (VII)$$

In the formula (VII), A is at least one selected from the group consisting of K, Li, Na, Rb, Cs, and $NH_4^+$; $M^1$ is at least one element selected from the group consisting of an element belonging to the Group 4 and an element belonging to the Group 14; and u is a number satisfying $0<u<0.2$.

The light emission peak wavelength of the second fluorescent material is 600 nm or more and 680 nm or less, preferably 610 nm or more and 675 nm or less, still more preferably 620 nm or more and 670 nm or less, and yet still more preferably 620 nm or more and 660 nm or less. By allowing it to fall within the aforementioned range, the light emission spectrum in an orange to red region of the light emitted from the light emitting device can be made close to the light emission spectrum of the reference light source.

A half width of the light emission spectrum of the second fluorescent material is preferably 120 nm or less, more preferably 70 nm or more and 120 nm or less, still more preferably 75 nm or more and 118 nm or less, and yet still more preferably 80 nm or more and 115 nm or less. By allowing it to fall within the aforementioned range, the light emission spectrum in an orange to red region of the light emitted from the light emitting device can be made close to the light emission spectrum of the reference light source.

A content ratio of the second fluorescent material relative to the total fluorescent material amount is preferably 1% by mass or more, more preferably 2% by mass or more, and still more preferably 3% by mass or more. In addition, the content ratio of the second fluorescent material relative to the total fluorescent material amount is preferably 30% by mass or less, more preferably 25% by mass or less, still more preferably 20% by mass or less, and yet still more preferably 10% by mass or less. When the content ratio falls within the aforementioned range, the light emission spectrum of the light emitting device emitting a light having a correlated color temperature of 2,000 K or higher and 7,000 K or lower can be made closer to the reference light source, and therefore, the color rendering property can be more enhanced. In the case of using two or more kinds of second fluorescent materials, it is preferred to regulate a total amount of the second fluorescent materials so as to fall within the aforementioned range of the content ratio. At this time, a mixing ratio of the respective second fluorescent materials may be properly regulated according to the light emission spectrum or correlated color temperature of the light emitted from the light emitting device, and for example, it can also be equal amounts.

A mass ratio of the first fluorescent material to the second fluorescent material (the mass of the first fluorescent material:the mass of the second fluorescent material) is preferably in a range of from 70:30 to 99:1, more preferably in a range of from 75:25 to 98:2, still more preferably in a range of from 80:20 to 97:3, and yet still more preferably in a range of from 90:10 to 97:3. By allowing the mass ratio of the first fluorescent material and the second fluorescent material to fall within the aforementioned range, the color rendering property of the light emitting device can be more improved.

Other Fluorescent Material

The light emitting device may contain other fluorescent material than the first fluorescent material and the second fluorescent material, as the need arises. Specifically, examples of the other fluorescent material include the following fluorescent materials.

Examples of a fluorescent material emitting an orange light include $(Ca,Sr)_2SiO_4{:}Eu$, $Sr_3SiO_5{:}Eu$, and $(Ca,Sr,Li,Y)_x(Si,Al)_{12}(O,N)_{16}{:}Eu$ ($0\leq x\leq 3$).

Examples of a fluorescent material emitting a yellow light include $Y_3(Al,Ga)_5O_{12}{:}Ce$, $Tb_3Al_5O_{12}{:}Ce$, and $Lu_3Al_5O_{12}{:}Ce$.

Examples of a fluorescent material emitting a green light include silicate fluorescent materials, such as $(Ca,Sr,Ba)_2SiO_4{:}Eu$ and $Ca_3Sc_2Si_3O_{12}{:}Ce$, chlorosilicate fluorescent materials, such as $Ca_8MgSi_4O_{16}Cl_2{:}Eu,Mn$, oxynitride fluorescent materials, such as $(Ca,Sr,Ba)_3Si_6O_9N_4{:}Eu$, $(Ca,Sr,Ba)_3Si_6O_{12}N_2{:}Eu$, $(Ca,Sr,Ba)Si_2O_2N_2{:}Eu$, and a β-type sialon of $Si_{6-k}Al_kO_kN_{8-k}{:}Eu$ ($0<k<4.2$), rare earth silicon nitride-based fluorescent materials, such as $(La,Y,Gd)_3Si_6N_{11}$:Ce, Mn-activated aluminate fluorescent material, such as $(Ba, Sr,Ca)MgAl_{10}O_{17}$:Mn, Eu-activated sulfide fluorescent materials, such as $SrGa_2S_4$:Eu, and oxide fluorescent materials, such as $CaSc_2O_4$:Ce.

Examples of a fluorescent material emitting a blue light include $(Sr,Ca,Ba)Al_2O_4$:Eu, $(Sr,Ca,Ba)_4Al_{14}O_{25}$:Eu, $(Ba,Sr,Ca)MgAl_{10}O_{17}$:Eu, Eu,Tb,Sm-activated aluminate fluorescent materials, such as $BaMgAl_{14}O_{25}$:Eu,Tb,Sm, Eu,Mn-activated aluminate fluorescent materials, such as $(Ba,Sr,Ca)MgAl_{10}O_{17}$:Eu,Mn, Ce-activated thiogallate fluorescent materials, such as $SrGa_2S_4$:Ce and $CaGa_2S_4$:Ce, Eu-activated silicate fluorescent materials, such as $(Ba,Sr,Ca,Mg)_2SiO_4$:Eu, Eu-activated halophosphate fluorescent materials, such as $(Sr,Ca,Ba,Mg)_{10}(PO_4)_6(F,Cl,Br)_2$:Eu, and Eu-activated silicate fluorescent materials, such as $(Ca,Sr,Ba)_3MgSi_2O_8$:Eu.

Specific Embodiments of Light Emitting Device

The mode of the light emitting device according to an embodiment of the present disclosure is not particularly limited but can be properly selected among usually adopted modes. Examples of the mode of the light emitting device include a pin through type and a surface mounting type. In general, the pin through type refers to one in which leads (pins) of a light emitting device are penetrated into through-holes provided in a mounting board, thereby immobilizing the light emitting device. In addition, the surface mounting type refers to one in which leads of a light emitting device are immobilized on the surface of a mounting board.

The light emitting device according to an embodiment of the present disclosure includes a first light emitting element, a second light emitting element, a first fluorescent material, and a second fluorescent material as a whole of the light emitting device. In such a light emitting device, though a combination of the respective members can be properly selected, the following two embodiments can be roughly exemplified. Preferred embodiments of the light emitting device according an embodiment of the present disclosure are hereunder specifically described with respect to a surface mounting type light emitting device as an example while referring to the accompanying drawings.

First Embodiment

A light emitting device according to a first embodiment includes one molded article, and a first light emitting element, a second light emitting element, a first fluorescent material and a second fluorescent material arranged within the one molded article. The present embodiment can include all of the constitutional members in the one molded article, and therefore, it is good in the integrity as a light emitting device.

Figure 1B:
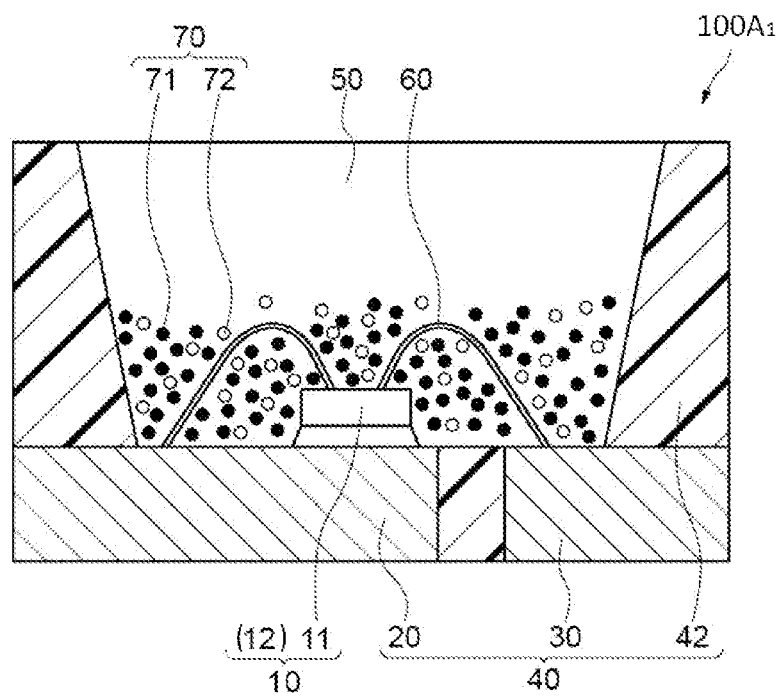
FIG. 1B is a schematic cross-sectional view showing a light emitting device according to an embodiment of the present disclosure.
Figure 2:
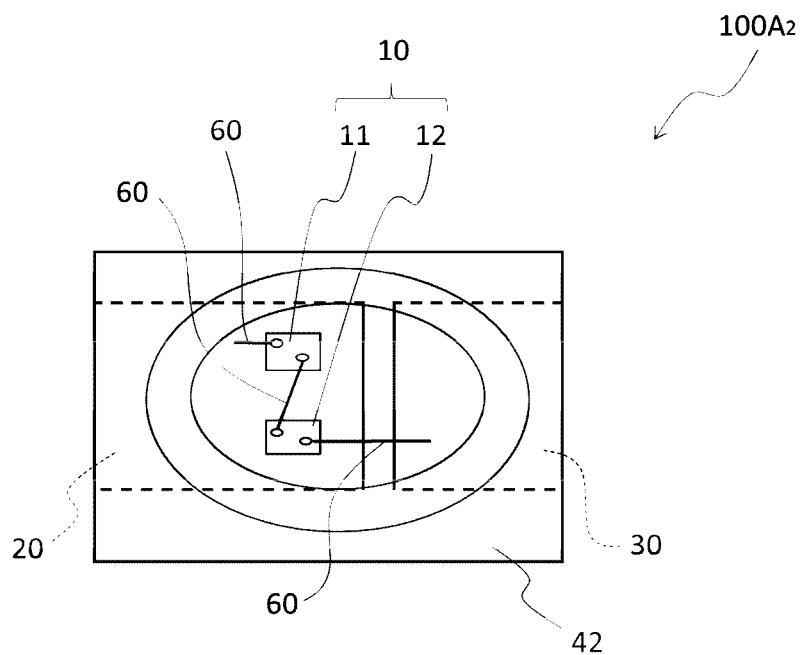
FIG. 2 is a schematic plan view showing another a light emitting device according to an embodiment of the present disclosure.

FIGS. 1A, 1B and 2 each show an example of the light emitting device according to the first embodiment. Here, FIG. 1A is a schematic plan view of a light emitting device 100A₁ that is an example of the light emitting device according to the first embodiment, and FIG. 1B is a schematic cross-sectional view on a I-I plane of the light emitting device 100A₁ of FIG. 1A. In addition, FIG. 2 is a schematic plan view of a light emitting device 100A₂ that is another example of the light emitting device according to the first embodiment.

The light emitting device 100A₁ shown in FIGS. 1A and 1B, and the light emitting device 100A₂ shown in FIG. 2 are substantially the same as each other, except that the electrical connection between a first light emitting element 11 and a second light emitting element 12 is different in terms of whether it is parallel connection or series connection, and the light emitting device is hereunder summarily described as "light emitting device 100A", unless otherwise indicated. In consequence, though the cross section of the light emitting device 100A is described while referring to the light emitting device 100A₁ of FIG. 1B, the same is also applicable to the light emitting device 100A₂ of FIG. 2, unless otherwise indicated.

The light emitting device 100A includes one molded article 40. The molded article 40 contains a first lead 20, a second lead 30, and a resin part 42 containing a thermoplastic resin or a thermosetting resin, in which these members are integrally molded. In addition, the molded article 40 forms a depression having a bottom surface formed by the first lead 20 and the second lead 30 and a side surface formed by the resin part 42, and the first light emitting element 11 and the second light emitting element 12 as a light emitting element 10 are mounted on the bottom surface of the depression.

The light emitting device 100A includes the first light emitting element 11 and the second light emitting element 12 as the light emitting element 10. In the interior of the light emitting device 100A, though the first light emitting element 11 and the second light emitting element 12 are different from each other in a planar positional relation (see FIG. 1A and FIG. 2), they are basically identical with each other in a positional relation viewed from the cross section (see FIG. 1B). The first light emitting element 11 and the second light emitting element 12 are hereunder summarily described as the light emitting element 10.

The light emitting element 10 has a pair of positive and negative electrodes, and positive and negative electrodes of the pair are respectively electrically connected to the first lead 20 and the second lead 30 via wires 60.

For example, in the case of the light emitting device 100A₁ in FIGS. 1A and 1B, as shown in FIG. 1B, the positive electrode and the negative electrode of the first light emitting device 11 are electrically connected to the first lead 20 and the second lead 30, respectively. Though the first light emitting element 11 is illustrated in FIG. 1B, the second light emitting element 12 is also electrically connected in the same way as the first light emitting element 11, its positive electrode and negative electrode are electrically connected to the first lead 20 and the second lead 30, respectively. Such light emitting device 100A₁ is constituted such that the first light emitting element 11 and the second light emitting element 12 are connected to each other in parallel, as shown in FIG. 1A.

In the case of the light emitting device 100A₂ in FIG. 2, the positive electrode of the first light emitting element 11 is electrically connected to the first lead 20, the negative electrode of the first light emitting element 11 is electrically connected to the positive electrode of the second light emitting element 12, and the negative electrode of the second light emitting element 12 is electrically connected to the second lead 30. Such light emitting device 100A₂ is constituted such that the first light emitting element 11 and the second light emitting element 12 are connected to each other in series, as shown in FIG. 2.

In the first lead 20 and the second lead 30 that are connected to the respective electrodes of the light emitting element 10, a part of each of the first lead 20 and the second lead 30 is exposed from the resin part 42 towards the exterior of a package constituting the light emitting device 100A. An electrical power is externally supplied to the light emitting element 10 via these first lead 20 and second lead 30 to emit a light, thereby enabling the light emitting device 100A to emit a light.

In the light emitting device 100A according to the present embodiment, its positional relation and electrical connection are not particularly limited but can be properly selected so long as the first light emitting element 11 and the second light emitting element 12 are arranged within the one molded article 40. That is, while FIGS. 1A, 1B and 2 have been illustrated herein as one example, the light emitting device 100A may be any of the embodiments of FIGS. 1A, 1B and 2 and may also be other embodiment.

The light emitting device 100A includes a first fluorescent material 71 and a second fluorescent material 72 as a fluorescent material 70 that converts the wavelength of a light emitted from the light emitting element 10. In FIG. 1A and FIG. 2, in order to make it easy to describe the positional relation between the first light emitting element 11 and the second light emitting element 12, though the fluorescent material 70 is shown while being transmitted, the first fluorescent material 71 and the second fluorescent material 72 are arranged so as to cover the light emitting element 10, as shown in FIG. 1B.

Such first fluorescent material 71 and second fluorescent material 72 are contained in a fluorescent member 50. The fluorescent member 50 is filled with and formed of a resin or a glass so as to cover the light emitting element 10 mounted within the depression of the molded article 40. The fluorescent member 50 may further contain other fluorescent material than the first fluorescent material 71 and the second fluorescent material 72, as the need arises.

The fluorescent member 50 functions not only as a wavelength converting member containing the fluorescent material 70 but also as a member for protecting the fluorescent material 70 and the light emitting element 10 from the external environment. In FIG. 1B, the fluorescent material 70 is unevenly distributed in the fluorescent member 50. By arranging the fluorescent material 70 closely to the light emitting element 10 in this way, the light from the light emitting element 10 can be efficiently subjected to wavelength conversion, and a light emitting device with excellent light emission efficiency can be provided. The arrangements of the light emitting element 10 and the fluorescent member 50 containing the fluorescent material 70 are not limited to the embodiment in which they are arranged closely to each other, and taking into consideration an influence of heat against the fluorescent material 70, the light emitting element 10 and the fluorescent material 70 can also be arranged leaving a space in the fluorescent member 50. In addition, by mixing the fluorescent material 70 in the whole of the fluorescent member 50 in a substantially uniform proportion, a light with more suppressed color unevenness can also be obtained.

It is preferred that the light emitting device 100A includes the first fluorescent material 71, the second fluorescent material 72 and the fluorescent member 50 containing a resin. Examples of the resin that constitutes such a fluorescent member include a thermoplastic resin and a thermosetting resin. Specifically, examples of the thermosetting resin include an epoxy resin, a silicone resin, and a modified silicone resin, such as an epoxy-modified silicone resin.

In such light emitting member 50, a total amount of the first fluorescent material 71 and the second fluorescent material 72 is preferably 30 parts by mass or more and 250 parts by mass or less, more preferably 35 parts by mass or more and 245 parts by mass or less, still more preferably 40 parts by mass or more and 240 parts by mass or less, and yet still more preferably 50 parts by mass or more and 235 parts by mass or less based on 100 parts by mass of the resin. By allowing it to fall within the aforementioned range, the light emitting from the light emitting element 10 can be efficiently subjected to wavelength conversion by the fluorescent material 70.

The fluorescent member 50 may further contain other component in addition to the fluorescent material 70 and the resin, as the need arises. Examples of the other component include a filler, a light stabilizer, and a colorant. In addition, examples of the filler include silica, barium titanate, titanium oxide, and aluminum oxide. In addition, when the fluorescent member 50 contains the filler as a light diffusing agent, directionality from the light emitting element 10 can be wider, and a viewing angle can be increased. In the case where the fluorescent member 50 contains other component, its content is not particularly limited but can be properly selected according the purpose or the like. For example, in the case of containing the filler as the other component, its content can be set to 0.01 parts by weight or more and 20 parts by weight or less based on 100 parts by weight of the resin.

Such light emitting device 100A is able to realize a high color rendering property in a wide range of correlated color temperature, for example, at a correlated color temperature of 2,000 K or higher and 7,000 K or lower.

In the light emitting device 100A, as for a method of regulating an output light L to a desired color tone, the regulation can be, for example, achieved by regulating compositions of the first fluorescent material 71 and the second fluorescent material 72, a blending ratio of these fluorescent materials, a blending amount of the fluorescent material 70 relative to the resin, and the like in the fluorescent member 50.

Second Embodiment

A light emitting device according to a second embodiment includes a first molded article and a second molded article, a first light emitting element arranged within the first molded article, a second light emitting element arranged within the second molded article, a first fluorescent material arranged within at least one of the first molded article and the second molded article, and a second fluorescent material arranged within at least one of the first molded article and the second molded article.

The first fluorescent material and the second fluorescent material may be each disposed in at least one of the first molded article and the second molded article, and furthermore, other fluorescent material than the first fluorescent material and the second fluorescent material may also be disposed in either or both of the first molded article and the second molded article, as the need arises. In particular, it is preferred that in each of the first molded article and the second molded article, both of the first fluorescent material and the second fluorescent material are disposed. At this time, the first fluorescent material and the second fluorescent material to be disposed in the first molded article and the first fluorescent material and the second fluorescent material to be disposed in the second molded article may be the same as or different from each other, respectively in terms of a composition.

As mentioned above, the light emitting device according to the present embodiment is abundant in terms of variations regarding a combination of the light emitting element and the fluorescent material, and a combination of the fluorescent materials each other. For that reason, a flexibility in designing as a whole of the light emitting device is improved. Specifically, examples thereof include (i) an embodiment including a first light emitting element and the first fluorescent material and the second fluorescent material, each being arranged within the first molded article, and including the second light emitting element and the first fluorescent material and the second fluorescent material, each being arranged within the second molded article; (ii) an embodiment including the first light emitting element and the first fluorescent material, each being arranged within the first molded article, and including the second light emitting element and the second fluorescent material, each being arranged within the second molded article; and (iii) an embodiment including the first light emitting element and the first fluorescent material and the second fluorescent material, each being arranged within the first molded article, and including the second light emitting element and other fluorescent material, each being arranged within the second molded article. All of these embodiments include the first light emitting element, the second light emitting element, the first fluorescent material, and the second fluorescent material as a whole of the light emitting device, and therefore, the light emitted from such a light emitting device exhibits an excellent color rendering property.

Figure 3A:
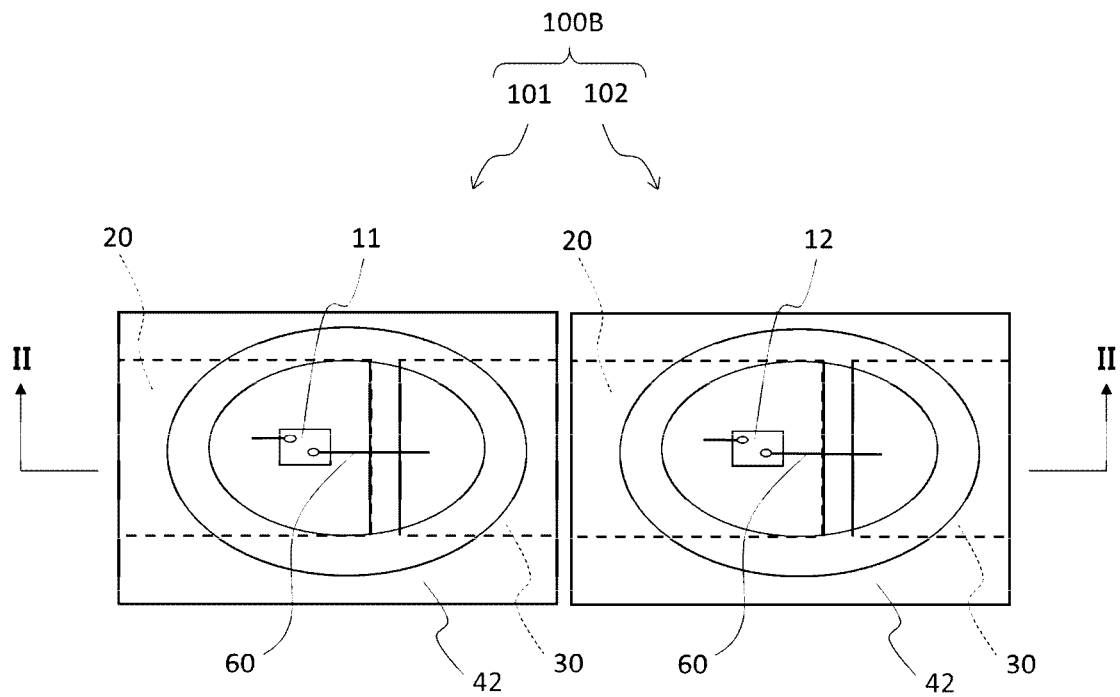
FIG. 3A is a schematic plan view showing still another a light emitting device according to an embodiment of the present disclosure.
Figure 3B:
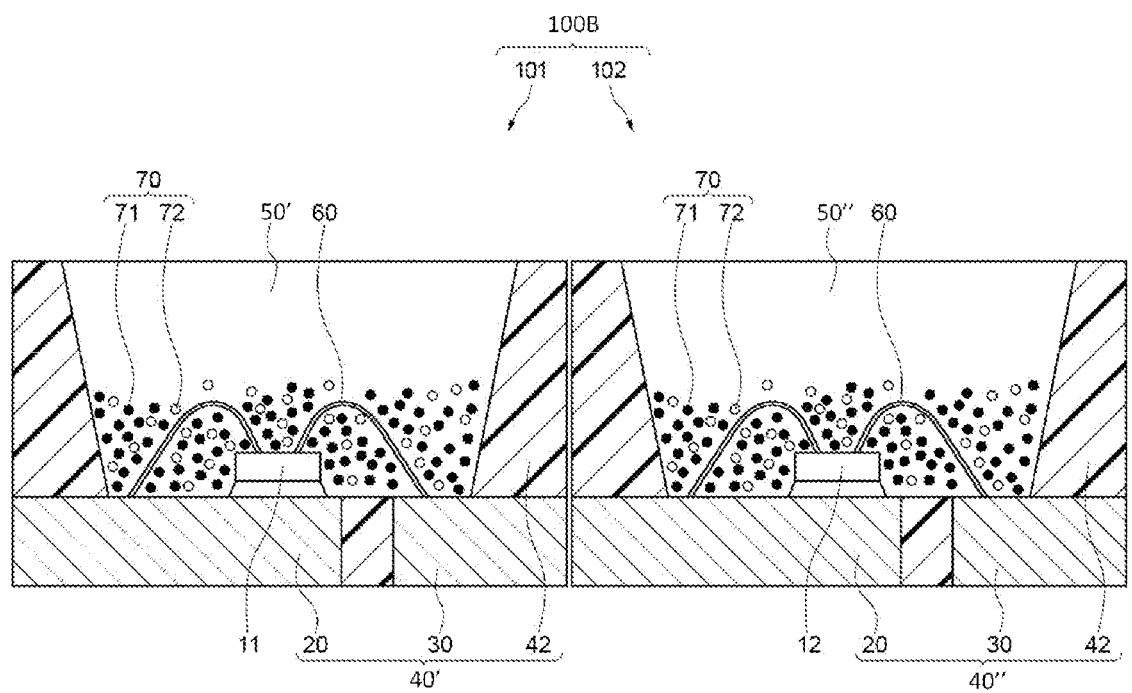
FIG. 3B is a schematic cross-sectional view showing still another a light emitting device according to an embodiment of the present disclosure.

FIG. 3A is a schematic plan view of a light emitting device 100B that is an example of the light emitting device according to the second embodiment, and FIG. 3B is a schematic cross-sectional view on a II-II plane of the light emitting device 100B of FIG. 3A. The light emitting device shown in FIG. 3 is described below as an example.

In FIGS. 3A and 3B, a package 101 mounting a first light emitting element 11 within a first molded article 40' and a package 102 mounting a second light emitting element 12 within a second molded article 40" are integrated to constitute the one light emitting device 100B. Here, the first fluorescent material 71 and the second fluorescent material 72 are disposed in the first molded article 40' and the second molded article 40", respectively.

Such light emitting device 100B is different from the light emitting device 100A according to the aforementioned first embodiment at a point that the first light emitting element 11 as the light emitting element 10 is mounted on a bottom surface of a depression of the first molded article 40' and the second light emitting element 12 as the light emitting element 10 is mounted on a bottom surface of a depression of the second molded article 40". However, the basic structure of each of the first molded article 40' and the second molded article 40" of the light emitting device 100B is substantially the same as in the case of the light emitting device 100A. In addition, the electric connection regarding each of the first light emitting element 11 and the second light emitting element 12 is substantially the same as in the case of the first light emitting element 11 of the light emitting device $100A_1$ shown in FIG. 1B.

The light emitting device 100B includes the first fluorescent material 71 and the second fluorescent material 72 which are arranged within the first molded article 40' and the second molded article 40", respectively. Such first fluorescent material 71 and second fluorescent material 72 are contained in a first fluorescent member 50' and a second fluorescent member 50", respectively. The first fluorescent member 50' is filled and formed so as to cover the light emitting element 11 mounted within the depression of the first molded article 40', and the second fluorescent member 50" is filled and formed so as to cover the light emitting element 12 mounted within the depression of the second molded article 40". The basic constitution of each of the first fluorescent member 50' and the second fluorescent member 50" is substantially the same as in the case of the fluorescent member 50 of the light emitting device 100A according to the aforementioned first embodiment. The first fluorescent member 50' and the second fluorescent member 50" may be a fluorescent member having the same composition, or may be a different fluorescent member from each other with respect to the composition of each of the first fluorescent material 71 and the second fluorescent material 72, a blending ratio thereof, a blending amount of the fluorescent material 70 relative to the resin, and so on.

The light emitting device 100B is able to realize a high color rendering property in a wide range of correlated color temperature, for example, at a correlated color temperature of 2,000 K or higher and 7,000 K or lower, as a whole of the light emitting device by a mixed light of an output light 1 of the package 101 and an output light 2 of the package 102.

In such light emitting device 100B, examples of a method of regulating an output light L to a desired color tone include the following methods.

First of all, a first method is a method in which each of color tones of the output light 1 of the package 101 and the output light 2 of the package 102 is approximated to the color tone of the output light L from the light emitting device 100B which is desired to be finally regulated.

A second method is a method in which the color tone of the output light 1 of the package 101 and the color tone of the output light 2 of the package 102 are made different from each other, and when the two output lights are prepared as a mixed light, the color tones of the respective output lights are regulated such that the mixed light becomes a desired color tone of the output light L.

In all the aforementioned methods, in order to regulate the output light for every package to a desired color tone, it is preferred to properly regulate a composition of each of the fluorescent members while taking into consideration a combination of light emitting elements.

While the embodiments according to the present invention have been described, it should be construed that the present invention is by no means limited to the aforementioned embodiments, all embodiments falling within the concept of the present invention and the scope of claims are included, and various modifications can be made within the scope of the present invention.

EXAMPLES

The present invention is hereunder described in more detail by reference to Examples, but it should be construed that the present invention is by no means limited to the following Examples.

Light Emitting Element

The following light emitting elements were prepared, respectively as a light emitting element of each of the Examples and Comparative Examples.

A gallium nitride-based semiconductor light emitting element emitting a bluish purple light and having a light emission peak wavelength of 430 nm was prepared as a first light emitting element.

A gallium nitride-based semiconductor light emitting element emitting a blue light and having a light emission peak wavelength of 460 nm was prepared as a second light emitting element.

A gallium nitride-based semiconductor light emitting element emitting a blue light and having a light emission peak wavelength of 450 nm was prepared as other light emitting element than those mentioned above.

Fluorescent Material

The following fluorescent materials were prepared, respectively as a fluorescent material of each of the Examples and Comparative Examples.

A fluorescent material (hereinafter also referred to as "G-LAG") emitting a green light, having a composition represented by $Lu_3(Al_{0.9}Ga_{0.1})_5O_{12}:Ce$, having a light emission peak wavelength of 520 nm, and having a half width of 99 nm was prepared as a first fluorescent material.

A nitride fluorescent material (hereinafter also referred to as "CASN") emitting a red light, having a composition represented by $CaAl_{0.9}Si_{1.1}N_3:Eu$, having a light emission peak wavelength of 650 nm, and having a half width of 93 nm was prepared as a second fluorescent material.

A nitride fluorescent material (hereinafter also referred to as "SCASN") emitting a red light, having a composition represented by $Sr_{0.8}Ca_{0.2}AlSiN_3:Eu$, having a light emission peak wavelength of 640 nm, and having a half width of 95 nm was prepared as a second fluorescent material.

A fluorescent material (hereinafter also referred to as "LAG") emitting a green light, having a composition represented by $Lu_3Al_5O_{12}:Ce$, having a light emission peak wavelength of 534 nm, and having a half width of 99 nm was prepared as other fluorescent material than those mentioned above.

Example 1

The first light emitting element having a light emission peak wavelength at 430 nm and the second light emitting element having a light emission peak wavelength at 460 nm were combined with G-LAG that is the first fluorescent material and CASN and SCASN that are each the second fluorescent material, thereby producing the light emitting device shown in FIG. 2. Specifically, the production was performed by the following process.

First of all, G-LAG, CASN, and SCASN were blended so as to control the correlated color temperature of the light emitted by the light emitting device to around 3,000 K, thereby preparing a fluorescent material in a proportion shown in Table 1 in terms of a content ratio of the respective fluorescent materials. Subsequently, this fluorescent material was blended with a silicone resin in a blending amount shown in Table 1, mixed and dispersed, and then defoamed, thereby obtaining a fluorescent material-containing resin composition. This fluorescent material-containing resin composition was injected on the light emitting element mounted within a depression of a molded article and filled in the depression of the molded article, and the assembly was heated to cure the fluorescent material-containing resin composition, thereby forming a light emitting member. There was thus obtained a light emitting device.

Example 2

In Example 2, a light emitting device was produced in the same manner as in Example 1, except that SCASN as the fluorescent material was not used, and the content ratio of the respective fluorescent materials and the blending amount of the fluorescent materials relative to the resin were changed as shown in Table 1 so as to control the correlated color temperature of the light emitted by the light emitting device to around 5,000 K.

Example 3

In Example 3, a light emitting device was produced in the same manner as in Example 1, except that the content ratio of the respective fluorescent materials and the blending amount of the fluorescent materials relative to the resin were changed as shown in Table 1 so as to control the correlated color temperature of the light emitted by the light emitting device to around 5,000 K.

Example 4

In Example 4, a light emitting device was produced in the same manner as in Example 1, except that SCASN as the fluorescent material was not used, and the content ratio of the respective fluorescent materials and the blending amount of the fluorescent materials relative to the resin were changed as shown in Table 1 so as to control the correlated color temperature of the light emitted by the light emitting device to around 6,500 K.

Example 5

In Example 5, a light emitting device was produced in the same manner as in Example 1, except that the content ratio of the respective fluorescent materials and the blending amount of the fluorescent materials relative to the resin were changed as shown in Table 1 so as to control the correlated color temperature of the light emitted by the light emitting device to around 6,500 K.

Comparative Example 1

In Comparative Example 1, a light emitting device was produced in the same manner as in Example 1, except that LAG was used as the fluorescent material in place of G-LAG, SCASN was not used, and the content ratio of the respective fluorescent materials and the blending amount of the fluorescent materials relative to the resin were changed as shown in Table 1. In Comparative Example 1, the fluorescent material was prepared to control the color temperature to around 3,000 K.

Comparative Example 2

In Comparative Example 2, a light emitting device was produced in the same manner as in Comparative Example 1, except that the content ratio of the respective fluorescent materials and the blending amount of the fluorescent materials relative to the resin were changed as shown in Table 1 so as to control the correlated color temperature of the light emitted by the light emitting device to around 5,000 K.

Comparative Example 3

In Comparative Example 3, a light emitting device was produced in the same manner as in Comparative Example 1, except that the content ratio of the respective fluorescent materials and the blending amount of the fluorescent materials relative to the resin were changed as shown in Table 1 so as to control the correlated color temperature of the light emitted by the light emitting device to around 6,500 K.

Comparative Example 4

In Comparative Example 4, a light emitting device was produced in the same manner as in Example 1, except that the light emitting element having a light emission peak wavelength at 450 nm was used alone in place of the first light emitting element having a light emission peak wavelength at 430 nm and the second light emitting element having a light emission peak wavelength at 460 nm, and the content ratio of the respective fluorescent materials and the blending amount of the fluorescent materials relative to the resin were changed as shown in Table 1 so as to control the correlated color temperature of the light emitted by the light emitting device to around 5,000 K.

Each of the light emitting devices of the aforementioned Examples and Comparative Examples was measured for the light emission spectrum, the chromaticity coordinate of the light emission color, the correlated color temperature (Tcp; K), the special color rendering indexes (R1 to R15), and the general color rendering index (Ra). In the following description, the general color rendering index and the special color rendering indexes are also collectively referred to simply as "color rendering index". The results are shown in Table 1.

TABLE 1

| | | | Comparative Example 1 | Example 1 | Comparative Example 2 | Example 2 | Example 3 |
|---|---|---|---|---|---|---|---|
| Target value of correlated color temperature of light emitted by light emitting device [K] | | | 3,000 | 3,000 | 5,000 | 5,000 | 5,000 |
| Light emitting element | Light emission peak wavelength [nm] | First light emitting element | 430 | 430 | 430 | 430 | 430 |
| | | Second light emitting element | 460 | 460 | 460 | 460 | 460 |
| | | Other light emitting element | — | — | — | — | — |
| Fluorescent material | Content ratio in total fluorescent material amount [% by mass] | First fluorescent material (G-LAG) | — | 93.4 | — | 94.5 | 95.8 |
| | | Other fluorescent material (LAG) | 93.7 | — | 95.7 | — | — |
| | | Second fluorescent material (CASN) | 6.3 | 3.3 | 4.4 | 5.5 | 2.1 |
| | | Second fluorescent material (SCASN) | — | 3.3 | — | — | 2.1 |
| | Blending amount based on 100 parts by mass of resin [parts by mass] | | 233.4 | 175.0 | 143.1 | 120.0 | 116.0 |
| Correlated color temperature [K] | | | 3047 | 3047 | 5019 | 5032 | 5029 |
| Chromaticity coordinate | x | | 0.434 | 0.434 | 0.345 | 0.345 | 0.345 |
| | y | | 0.404 | 0.404 | 0.355 | 0.355 | 0.355 |
| Color rendering index | Ra | | 95.9 | 98.2 | 92.9 | 95.9 | 96.4 |
| | R1 | | 97.5 | 98.3 | 95.7 | 98.4 | 97.8 |
| | R2 | | 98.7 | 99.1 | 93.5 | 98.0 | 96.9 |
| | R3 | | 93.4 | 98.1 | 90.7 | 93.5 | 94.9 |
| | R4 | | 92.9 | 97.4 | 91.8 | 94.4 | 96.2 |
| | R5 | | 96.4 | 97.9 | 95.1 | 97.7 | 97.6 |
| | R6 | | 98.7 | 97.3 | 92.3 | 97.5 | 96.4 |
| | R7 | | 95.1 | 99.2 | 91.6 | 94.6 | 96.0 |
| | R8 | | 94.6 | 98.5 | 92.5 | 92.8 | 95.7 |
| | R9 | | 95.3 | 96.0 | 91.1 | 88.6 | 92.5 |
| | R10 | | 96.1 | 99.2 | 84.7 | 94.4 | 91.9 |
| | R11 | | 92.1 | 95.9 | 94.5 | 95.5 | 97.5 |
| | R12 | | 83.9 | 90.0 | 85.4 | 91.3 | 92.2 |
| | R13 | | 98.8 | 98.4 | 94.4 | 99.8 | 97.2 |
| | R14 | | 95.5 | 98.1 | 94.5 | 95.9 | 96.7 |
| | R15 | | 96.6 | 99.0 | 93.9 | 96.2 | 96.6 |

| | | | Comparative Example 3 | Example 4 | Example 5 | Comparative Example 4 |
|---|---|---|---|---|---|---|
| Target value of correlated color temperature of light emitted by light emitting device [K] | | | 6,500 | 6,500 | 6,500 | 5,000 |
| Light emitting element | Light emission peak wavelength [nm] | First light emitting element | 430 | 430 | 430 | — |
| | | Second light emitting element | 460 | 460 | 460 | 450 |

TABLE 1-continued

| Fluorescent material | | Other light emitting element | — | — | — | — |
|---|---|---|---|---|---|---|
| Fluorescent material | Content ratio in total fluorescent material amount [% by mass] | First fluorescent material (G-LAG) | — | 94.7 | 96.8 | 95.2 |
| | | Other fluorescent material (LAG) | 96.6 | — | — | — |
| | | Second fluorescent material (CASN) | 3.4 | 5.3 | 1.6 | 2.4 |
| | | Second fluorescent material (SCASN) | — | — | 1.6 | 2.4 |
| Blending amount based on 100 parts by mass of resin [parts by mass] | | | 111.4 | 77.5 | 99.3 | 111.7 |
| Correlated color temperature [K] | | | 6537 | 6531 | 6537 | 5030 |
| Chromaticity coordinate | | x | 0.312 | 0.312 | 0.312 | 0.345 |
| | | y | 0.328 | 0.328 | 0.328 | 0.355 |
| Color rendering index | | Ra | 91.3 | 95.9 | 95.4 | 94.2 |
| | | R1 | 93.5 | 98.9 | 96.6 | 95.7 |
| | | R2 | 91.5 | 97.0 | 95.6 | 94.6 |
| | | R3 | 89.2 | 93.0 | 93.6 | 92.0 |
| | | R4 | 90.9 | 95.4 | 95.7 | 94.3 |
| | | R5 | 93.6 | 98.3 | 96.6 | 95.3 |
| | | R6 | 90.0 | 95.9 | 94.5 | 91.7 |
| | | R7 | 90.8 | 94.9 | 95.5 | 94.6 |
| | | R8 | 91.1 | 93.6 | 95.1 | 94.8 |
| | | R9 | 84.2 | 91.1 | 91.2 | 87.0 |
| | | R10 | 80.0 | 91.8 | 88.8 | 86.5 |
| | | R11 | 93.5 | 96.5 | 96.6 | 94.6 |
| | | R12 | 85.7 | 93.9 | 93.0 | 83.0 |
| | | R13 | 92.1 | 98.4 | 95.9 | 95.1 |
| | | R14 | 93.7 | 95.8 | 96.1 | 95.4 |
| | | R15 | 91.8 | 97.6 | 96.0 | 96.0 |

As shown in Table 1, in the light emitting devices of Examples 1 to 5, it was confirmed that by combining the first light emitting element having a light emission peak wavelength at 430 nm, the second light emitting element having a light emission peak wavelength at 460 nm, G-LAG that is the first fluorescent material, and CASN, or CASN and SCASN that are the second fluorescent material, excellent color rendering properties can be realized in a wide range of correlated color temperature (3,000 K, 5,000 K, and 6,500 K). In particular, in the light emitting devices of Examples 1 to 5, excellent color rendering properties were confirmed such that the general color rendering index Ra is 95 or higher, and all of the special color rendering indexes R9 to R15 are 88 or higher.

On the other hand, in the light emitting devices of Comparative Examples 1 to 3, LAG that is the other fluorescent material is used as the fluorescent material in place of G-LAG that is the first fluorescent material, and therefore, it was confirmed that the color rendering property is inferior at all of the correlated color temperatures, as compared with the light emitting devices of Examples 1 to 5. In particular, the special color rendering index R12 was less than 88 at all of the correlated color temperatures. In addition, at the correlated color temperatures of 5,000 K and 6,500 K, the general color rendering index Ra was less than 95, and the special color rendering index R10 was less than 88. Furthermore, at the correlated color temperature of 6,500 K, the special color rendering index R9 was less than 88. From this matter, in the light emitting devices of Examples 1 to 5, it was noted that in particular, by using G-LAG that is the first fluorescent material, a high color rendering property can be realized in a wide range of correlated color temperature.

Figure 4:
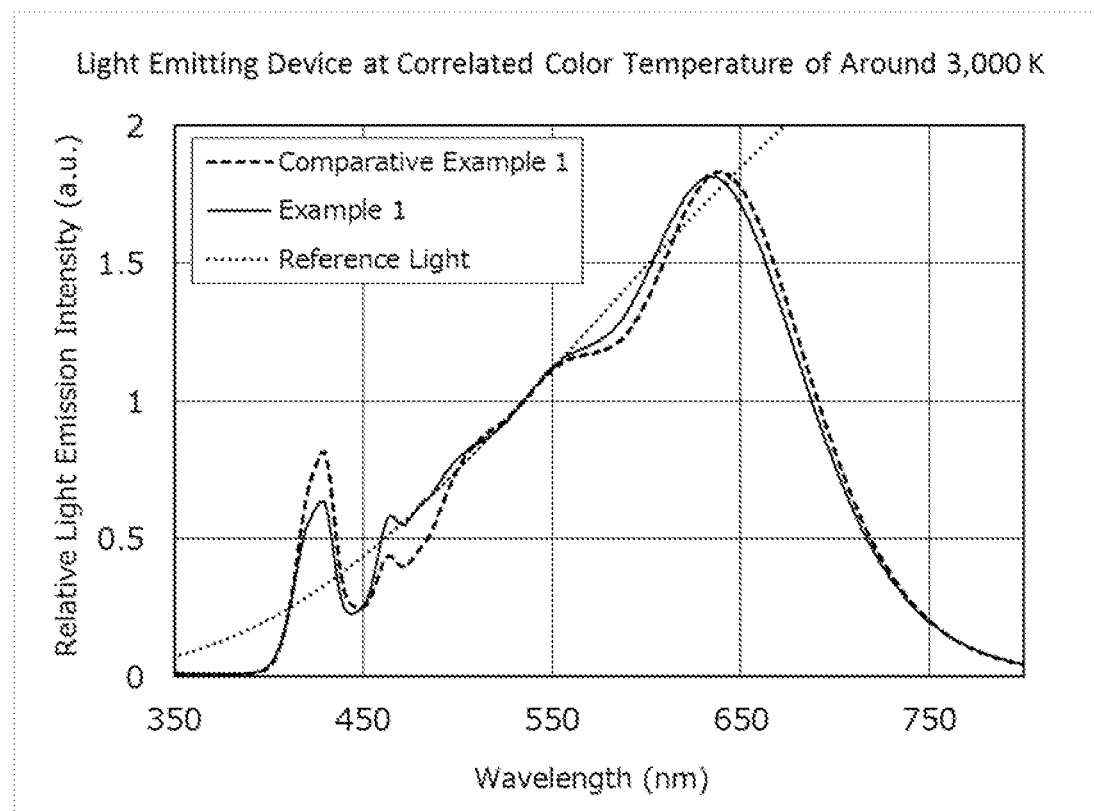
FIG. 4 is a graph showing a light emission spectrum of a reference light and light emission spectra of the light emitting devices according to Example 1 and Comparative Example 1 at a correlated color temperature of around 3,000 K.
Figure 5:
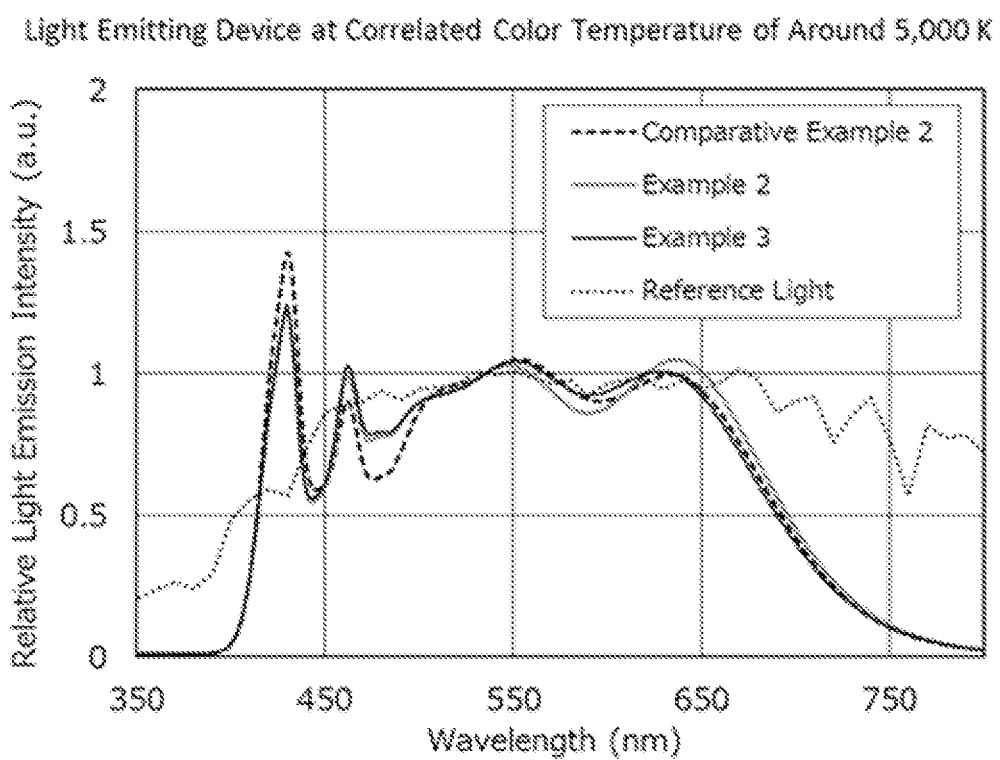
FIG. 5 is a graph showing a light emission spectrum of a reference light and light emission spectra of the light emitting devices according to Example 2, Example 3, and Comparative Example 2 at a correlated color temperature of around 5,000 K.
Figure 6:
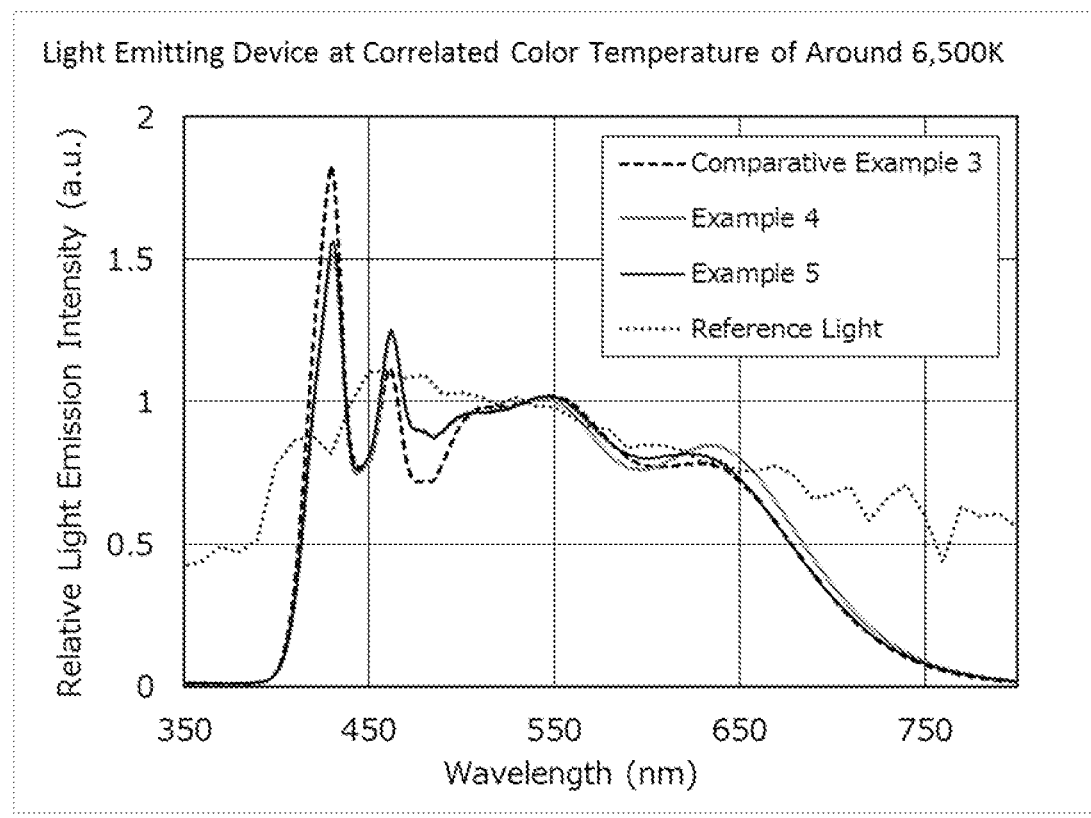
FIG. 6 is a graph showing a light emission spectrum of a reference light and light emission spectra of the light emitting devices according to Example 4, Example 5, and Comparative Example 3 at a correlated color temperature of around 6,500 K.

Next, FIGS. 4 to 6 show graphs in which the light emission spectra of the light emitting devices according to Examples 1 to 5 and Comparative Examples 1 to 3 and reference light spectra corresponding to the respective correlated color temperatures are normalized, respectively and compared at every correlated color temperature. In FIGS. 4 to 6, the light emission spectrum shows a relative light emission intensity (a.u.) relative to the wavelength.

As confirmed from FIGS. 4 to 6, in the light emitting devices using LAG that is the other fluorescent material as the fluorescent material in place of G-LAG that is the first fluorescent material, the light emitting devices of Comparative Examples 1 to 3 showed weak light emission intensity at around 470 nm to 500 nm. For that reason, in the light emitting devices of Comparative Examples 1 to 3, it may be considered that approximation of the light emission spectrum relative to the reference light spectrum in this wavelength band was lowered, and the color rendering property was worsened. In contrast, in the light emitting devices of Examples 1 to 5 using, as the fluorescent material, G-LAG that is the first fluorescent material, it may be considered that the light emission spectrum is more approximated relative to the reference light spectrum, and therefore, a high color rendering property is realized. In certain embodiments, a minimum light emission intensity of an emission spectrum of the light emitting device in the range of 470 nm or more and 500 nm or less is within the range of 0.7 or more and 1.1 or less with respect to a light emission intensity of the emission peak wavelength of the second light emitting element.

Figure 7:
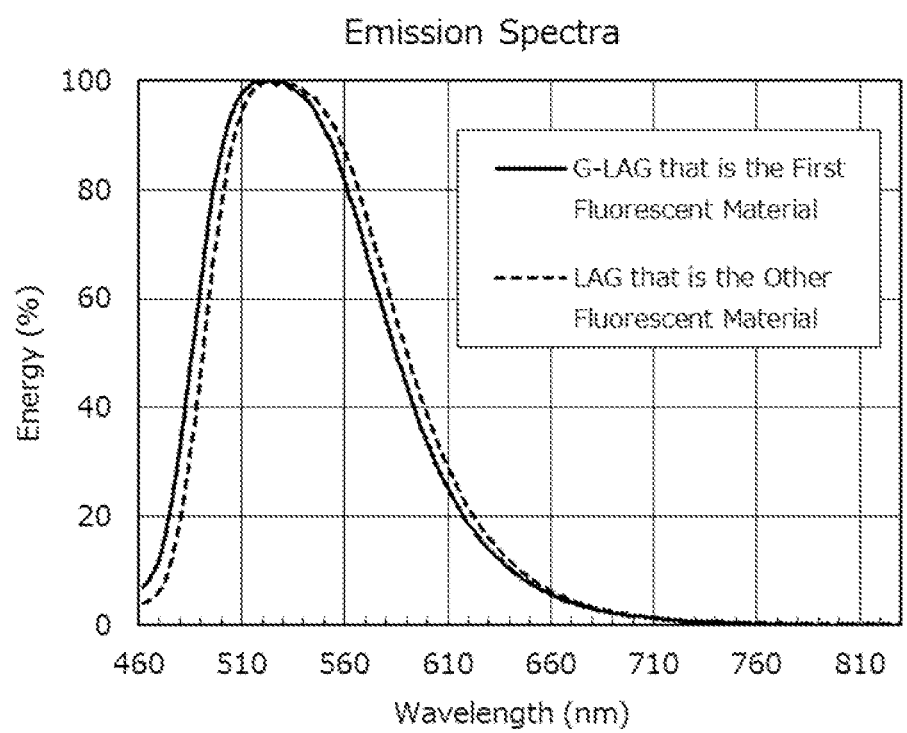
FIG. 7 is a graph showing emission spectra of G-LAG that is a first fluorescent material and LAG that is the other fluorescent material.
Figure 8:
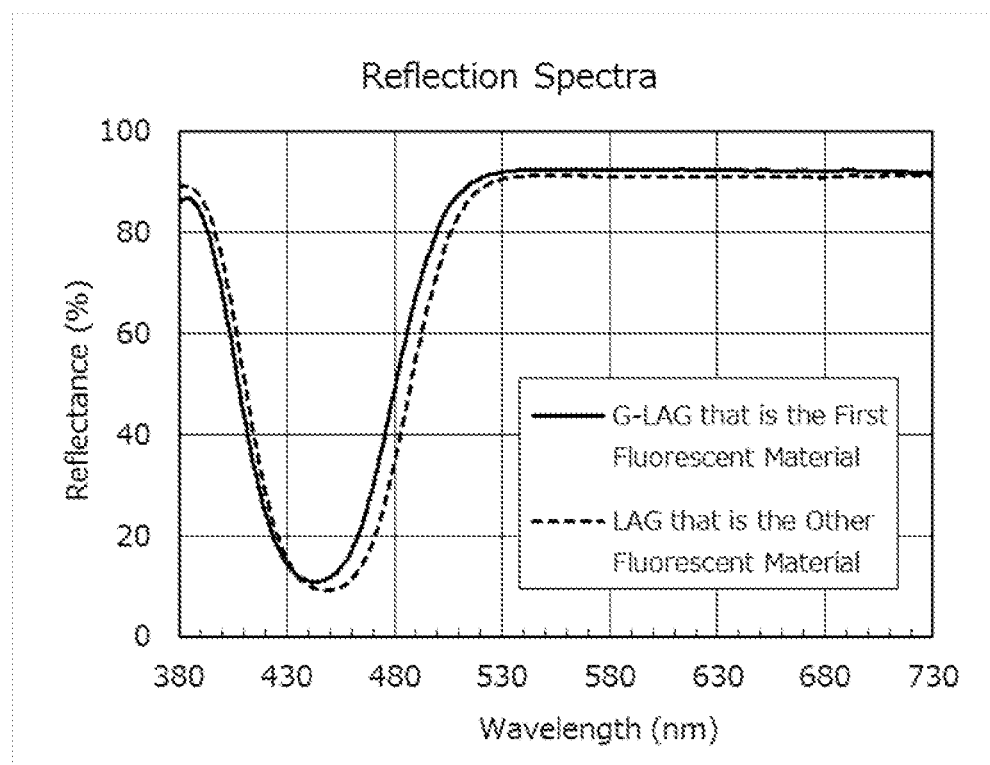
FIG. 8 is a graph showing reflection spectra of G-LAG that is a first fluorescent material and LAG that is the other fluorescent material.

In addition, with respect to G-LAG that is the first fluorescent material used in Examples 1 to 5 and LAG that is the other fluorescent material used in Comparative Examples 1 to 3, the respective light emission spectra and reflection spectra are shown in FIG. 7 and FIG. 8, respectively.

As shown in the light emission spectra of FIG. 7, as compared with LAG, when G-LAG is used, the light emission peak is a shortwave, and the light emission intensity in a range of 470 nm or more and 520 nm or less is large. In other words, as shown in the reflection spectra of FIG. 8, as compared with LAG, when G-LAG is used, the reflectance in a range of 470 nm or more and 520 nm or less is high, and therefore, the light emission component in the foregoing wavelength range is hardly absorbed. For that reason, for example, as shown in FIG. 5, as compared with the light emitting device using LAG that is the other fluorescent material (Comparative Example 2), in the light emitting devices of the present Examples (Examples 2 and 3) using G-LAG as the first fluorescent material, the light emission spectrum closer to the reference light can be obtained without largely depressing the light emission spectrum obtained in a blue to green region relative to the light emission spectrum of the reference light source, and the color rendering property can be improved.

In addition, as shown in the reflection spectra of FIG. 8, as compared with LAG, G-LAG is low in the reflectance in a range of 440 nm or less, and therefore, it readily absorbs the light emission component in the foregoing wavelength range. For that reason, for example, as shown in FIG. 5, as compared with the light emitting device using LAG that is the other fluorescent material (Comparative Example 2), in the light emitting devices of the present Examples (Examples 2 and 3) using G-LAG as the first fluorescent material, the light emission component in a range of 440 nm or less among the light emission spectra of the first light emitting element is suppressed, the light emission spectrum closer to the reference light can be obtained without largely protruding the light emission spectrum obtained in a bluish purple region relative to the light emission spectrum of the reference light source, and the color rendering property can be improved.

In addition, in the light emitting device of Comparative Example 4, the light emitting element having a light emission peak wavelength at 450 nm is used alone as the light emitting element. For that reason, when compared with the light emitting devices of Examples 2 and 3 having a correlated color temperature to the same degree (around 5,000 K), it was confirmed that the color rendering property is inferior. In particular, the general color rendering index Ra was less than 95, and the special color rendering indexes R9, R10, and R12 were less than 88. From this matter, it was confirmed that it is important to use a combination of the two kinds of light emitting elements having a different light emission peak from each other with G-LAG that is the first fluorescent material for the purpose of improving the color rendering property.

The light emitting device of the present invention can be utilized for a lighting apparatus, a LED display device, a flashlight for camera, a LCD backlight source, and the like, each having excellent light emission characteristics. In particular, the light emitting device of the present invention can be suitably utilized for light sources for medical use, illumination device for fine art, color comparison, or the like, each of which is required to have a high color rendering property.

What is claimed is:
1. A light emitting device comprising:
a first light emitting element having a light emission peak wavelength within a range of 400 nm or more and 490 nm or less,
a second light emitting element having a light emission peak wavelength different from the first light emitting element within a range of 450 nm or more and 490 nm or less,
a first fluorescent material that is excited by at least one of the first light emitting element and the second light emitting element and emits light having a light emission peak wavelength within a range of 500 nm or more and 540 nm or less, and
a second fluorescent material that is excited by at least one of the first light emitting element and the second light emitting element and emits light having a light emission peak wavelength within a range of 600 nm or more and 680 nm or less,
wherein the first fluorescent material is a Ce-activated aluminate fluorescent material containing Lu, Al, and Ga, and optionally at least one element selected from rare earth elements other than Lu, and
wherein a minimum light emission intensity of an emission spectrum of the light emitting device in the range of 470 nm or more and 500 nm or less is within the range of 0.7 or more and 1.1 or less with respect to a light emission intensity of the emission peak wavelength of the second light emitting element,
wherein the first fluorescent material has a composition represented by the following formula (I):

$$(Lu_{1-x}Ln_x)_3(Al_{1-y}Ga_y)_5O_{12}{:}Ce \qquad (I)$$

wherein Ln is at least one rare earth element selected from the group consisting of Y, Gd, and Tb; and x and y are numbers respectively satisfying 0≤x≤0.7 and 0<y≤0.5.

2. The light emitting device according to claim 1, wherein the second fluorescent material is a Eu-activated nitride fluorescent material containing Al, Si and at least one element selected from Sr and Ca.

3. The light emitting device according to claim 2, wherein the second fluorescent material has a composition represented by the following formula (II):

$$Sr_sCa_tAl_uSi_vN_w{:}Eu \qquad (II)$$

wherein s, t, u, v, and w are numbers respectively satisfying 0≤s≤1, 0≤t≤1, 0.8≤(s +t)≤1, 0.9≤u≤1.1, 0.9≤v≤1.1, and 2.5≤w≤3.5.

4. The light emitting device according to claim 3, wherein the second fluorescent material includes two or more fluorescent materials each represented by the formula (II) and having a different composition from each other.

5. The light emitting device according to claim 1, wherein a half width of a light emission peak in a light emission spectrum of the first fluorescent material is 90 nm or more and 120 nm or less.

6. The light emitting device according to claim 1, wherein a half width of a light emission peak in a light emission spectrum of the second fluorescent material is 120 nm or less.

7. The light emitting device according to claim 1, wherein a mass ratio of the first fluorescent material to the second fluorescent material (a mass of the first fluorescent material:a mass of the second fluorescent material) is in a range of from 70:30 to 99:1.

8. The light emitting device according to claim 1, wherein
the first light emitting element has a light emission peak wavelength within a range of 400 nm or more and less than 450 nm, and
the second light emitting element has a light emission peak wavelength within a range of 450 nm or more and 490 nm or less.

9. The light emitting device according to claim 1, wherein a difference between the light emission peak wavelength of the first light emitting element and the light emission peak wavelength of the second light emitting element is 5 nm or more.

10. The light emitting device according to claim 1, wherein a general color rendering index Ra is 95 or more.

11. The light emitting device according to claim 1, wherein all special color rendering indexes R9, R10, R11, R12, R13, R14, and R15 are 88 or more.

12. The light emitting device according to claim 1, wherein the light emitting device emits a light having a correlated color temperature of 2,000 K or more and 7,000 K or less.

13. The light emitting device according to claim 1,
wherein the first light emitting element, the second light emitting element, the first fluorescent material and the second fluorescent material are disposed within one molded article.

14. The light emitting device according to claim 13,
wherein the first fluorescent material, the second fluorescent material, and a resin are contained in a fluorescent member, and
a total amount of the first fluorescent material and the second fluorescent material in the fluorescent member is 30 parts by mass or more and 250 parts by mass or less based on 100 parts by mass of the resin.

15. The light emitting device according to claim 1,
wherein the first light emitting element is disposed within a first molded article,
the second light emitting element is disposed within a second molded article,
the first fluorescent material is disposed within at least one of the first molded article and the second molded article, and
the second fluorescent material is disposed within at least one of the first molded article and the second molded article.

16. The light emitting device according to claim 15, wherein both the first fluorescent material and the second fluorescent material are disposed within each of the first molded article and the second molded article.

17. The light emitting device according to claim 16,
wherein the first fluorescent material, the second fluorescent material, and a resin are contained in a fluorescent member, and
a total amount of the first fluorescent material and the second fluorescent material in the fluorescent member is 30 parts by mass or more and 250 parts by mass or less based on 100 parts by mass of the resin.

* * * * *